(12) United States Patent
Matsuoka (10) Patent No.: US 6,586,819 B2
(45) Date of Patent: Jul. 1, 2003

(54) SAPPHIRE SUBSTRATE, SEMICONDUCTOR DEVICE, ELECTRONIC COMPONENT, AND CRYSTAL GROWING METHOD

(75) Inventor: Takashi Matsuoka, Kanagawa (JP)

(73) Assignee: Nippon Telegraph and Telephone Corporation (JP)

( * ) Notice: Subject to any disclaimer, the term of this patent is extended or adjusted under 35 U.S.C. 154(b) by 0 days.

(21) Appl. No.: 09/927,223

(22) Filed: Aug. 10, 2001

(65) Prior Publication Data
US 2002/0033521 A1 Mar. 21, 2002

(30) Foreign Application Priority Data

Aug. 14, 2000 (JP) ........................................ 2000-245626

(51) Int. Cl.[7] ........................ H01L 31/036; H01L 29/22; H01L 29/24; C30B 1/00; C30B 29/20; H01S 5/40
(52) U.S. Cl. ......................... 257/628; 257/627; 257/94; 257/103; 117/9; 117/950; 438/938; 372/43; 372/45
(58) Field of Search ............................ 257/22, 94, 103, 257/190, 615, 627–8, 347; 428/689; 117/9, 950; 438/938; 372/43–46

(56) References Cited

U.S. PATENT DOCUMENTS 5,006,908 A    4/1991  Matsuoka et al. ............ 357/17
6,072,197 A  * 6/2000  Horino et al. ............... 257/103
6,083,812 A  * 7/2000  Summerfeldt ................ 438/481
6,153,010 A  * 11/2000 Kiyoku et al. ................ 117/95
6,265,089 B1 * 7/2001  Fatemi et al. ................ 428/698

FOREIGN PATENT DOCUMENTS

JP          2-211620        2/1989

OTHER PUBLICATIONS

Matsuoka et al., "Substrates for Epitaxial Growth of InGaAlN System and Growth on Their Substrates".

"Lattice–Matching Growth of InGaAlN Systems", Mat. Res. Soc. Symp. Proc. vol. 395, 1996 Materials Research Society, pp. 39–50.

* cited by examiner

Primary Examiner—Nathan J. Flynn
Assistant Examiner—Johannes P Mondt
(74) Attorney, Agent, or Firm—Blakely Sokoloff Taylor & Zafman (57) ABSTRACT

In a sapphire substrate having a heteroepitaxial growth surface, the heteroepitaxial growth surface is parallel to a plane obtained by rotating a $(01\bar{1}0)$ plane of the sapphire substrate about a c-axis of the sapphire substrate through 8° to 20° in a crystal lattice of the sapphire substrate. A semiconductor device, electronic component, and crystal growing method are also disclosed.

24 Claims, 7 Drawing Sheets

FIG.1

JUST SUBSTRATE

FIG.2A

15° TILTED SUBSTRATE

SAPPHIRE SUBSTRATE, SEMICONDUCTOR DEVICE, ELECTRONIC COMPONENT, AND CRYSTAL GROWING METHOD

BACKGROUND OF THE INVENTION

The present invention relates to a sapphire substrate having a heteroepitaxial growth surface, a semiconductor device having a group III nitride single-crystal layer grown on a substrate, an electronic component having a crystal layer of a nitride material on a crystal substrate having a rhombohedral crystal structure, and a crystal growing method.

Gallium-nitride-based materials have received a great deal of attention as semiconductor materials having large band-gap energy and high melting point. For example, a device is manufactured using an InGaAlN crystal. In manufacturing this device, a crystal film need be heteroepitaxially grown on a substrate. This is because there is no crystal substrate formed from a gallium-nitride-based crystal. Conventionally, a corundum (sapphire) substrate is mainly used as a substrate to heteroepitaxially grow a crystal film, and its (0001) plane (C plane) is used as a heteroepitaxial growth surface for growing a crystal of a nitride material, i.e., a heterogeneous material.

Normally, GaN, which most easily grows in this crystal system, is grown first on a sapphire substrate. This is because (1) to grow a mixed crystal, the compositional control is difficult, (2) a high temperature of 1,300° C. or more is required to grow AlN, and (3) to realize a high N equilibrium vapor pressure required in the growth of InN, the supply ratio N/In of the nitrogen material to the In material must be as high as about 1,000,000, and this reduces the growth rate to 100 nm/h or less, resulting in an industrial disadvantage.

Even in growing GaN, when a single crystal is directly grown on a substrate, only a crystal with a rough surface is obtained. It is difficult to form a crystal on such a surface. Even when a crystal is formed, the thickness of the formed layer is nonuniform, which makes it impossible to control the thickness in growth.

In addition, when a single crystal is directly grown, a crystal boundary is generated. This forms defects to largely damage the optical/electrical characteristics of the crystal. For the above reasons, a directly grown crystal cannot be used to manufacture a device.

To solve these problems, a two-step growing method has been used. This two-step growing method will be briefly described. GaN or AlN, which is polycrystalline, amorphous, or a mixture of these states, is grown to a thickness of 20 to 50 nm on a substrate at a low temperature (low-temperature buffer layer growth). The crystal is then converted into a single crystal at a high temperature (annealing), and high-quality single-crystal GaN is grown on it (actual growth). In this case, threading dislocations are present at a density of $10^8$ to $10^{10}/cm^2$ in the film because of a lattice-mismatch ratio of 13.8% between the substrate and GaN. These dislocations degrade the electrical/optical characteristics of GaN.

To reduce the dislocation density, a method appropriately using selective growth and lateral growth has been proposed. That is, GaN with a thickness on the submicron order is grown by the above-described method. Next, a large number of stripe-shaped patterns of $SiO_2$ are formed parallel on the GaN film as a selective growth mask. GaN is grown under such conditions that it readily grows in a direction (lateral direction) perpendicular to the film thickness direction between the stripes. As a result, GaN films grown laterally from both sides of each stripe-shaped $SiO_2$ film merge, so the entire surface of the substrate is covered with GaN.

To obtain a high-quality crystal, the GaN film must be as thick as 100 to 200 μm. However, the dislocations in the underlying GaN film remain in the crystals on the window portion. In addition, the merge portion of the GaN films contains numerous defects because the lattice constant of the substrate does not match that of the heteroepitaxially grown GaN film. A high-quality crystal is present only between the merge portion and the $SiO_2$ window portion. Even this portion has dislocations at a density of about $10^4$ to $10^6/cm^2$. Furthermore, the high-quality crystal portion has only a 5-μm wide stripe shape. This width cannot be increased because of limitations on the lateral growth technique.

A semiconductor laser structure is formed on the substrate with the GaN film deposited by the above-described method. A DVD apparatus which is regarded as the most important application purpose of the device requires a device lifetime of 100,000 hrs at an operation temperature of 50° C. and optical output of 30 mW, though the actual device lifetime is several hundred hrs at maximum, i.e., shorter by two or more orders of magnitude. This may be caused by distortion in the high-quality crystal portion and spread of dislocations on both sides of the high-quality crystal portion. Hence, the above-described method is still insufficient in terms of crystallinity.

Additionally, since the above-described crystal growing method requires three steps: (1) two-step growth comprising low-temperature buffer growth, and annealing and actual growth, (2) selective growth film formation and pattern formation, and (3) lateral growth, the process is complicated and the growth cost becomes high.

As a lattice-match substrate, a $(01\bar{1}0)$ plane (to be referred to as an M plane hereinafter) is present in a sapphire substrate. The present inventors have conventionally proposed this M plane as a heteroepitaxial growth surface (U.S. Pat. No. 5,006,908). At the time of this proposal (filed Feb. 13, 1989), not the two-step growth but direct growth had been executed to directly grow GaN on a substrate at a high temperature without intervening a GaN layer grown at a low temperature. In that age, a GaN crystal having satisfactory characteristics such as good surface planarity, low residual carrier concentration, high mobility, and high-intensity photoluminescence was obtained on the M plane rather than on the sapphire (0001) plane (to be referred to as a C plane hereinafter).

To further improve the crystallinity of GaN grown on the sapphire M plane, the two-step growth was executed using the sapphire M plane. The tilt angle of the substrate surface used at this time from the M plane was 0.3° or less in each orientation. The substrate had a plane that could normally be called a $(01\bar{1}0)$ just plane. However, the surface of the obtained GaN crystal was rougher than that of a GaN crystal obtained by two-step growth on a sapphire C plane.

Figure 8:
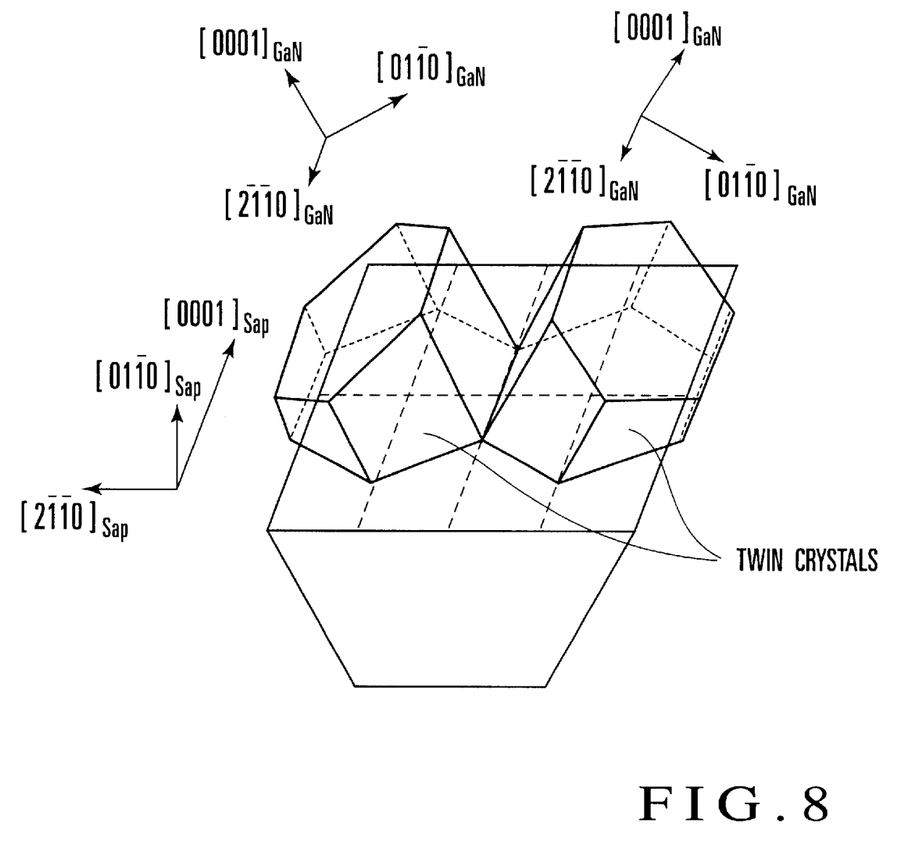
FIG. 8 is a perspective view schematically showing a state wherein a GaN crystal is grown on a sapphire M-plane just-substrate via a GaN buffer layer.

This is because twin crystals are easily formed on a substrate having a sapphire $(01\bar{1}0)$ just plane, as shown in FIG. 8. Twin crystals are formed because on the $(01\bar{1}0)$ just plane substrate, the c-axis of GaN tilts at 32° from the normal direction of the substrate surface to the $[2\bar{1}\bar{1}0]$ and $[\bar{2}110]$ directions of the sapphire substrate. That is, since the c-axis can be set in the two orientations, twin crystals are generated. Consequently, when a GaN buffer layer is formed on the substrate having the sapphire $(01\bar{1}0)$ just plane, and a gallium nitride crystal is grown on the GaN buffer layer, crystals grow in two directions to form twin crystals, as shown in FIG. 8.

Generally, to improve the crystallinity in heteroepitaxial growth, an off substrate that tilts with respect to the just plane through an appropriate angle (called an off angle) is used. In this case, the off angle is not so large and normally about 1° to 5°. When GaN was actually heteroepitaxially grown on a sapphire M substrate having such an off angle, no effect for suppressing twin crystal formation was obtained. This fact was revealed for the first time by actually growing the crystal.

As described above, conventionally, since it is difficult to obtain a nitride semiconductor with good crystallinity, a device having satisfactory characteristics can hardly be obtained using a nitride material such as a wide-gap semiconductor having a wide-band-gap energy.

SUMMARY OF THE INVENTION

The present invention has been made to solve the above problems, and has as its object to obtain a device having more excellent characteristics and having satisfactory electrical/optical characteristics and long lifetime, such as a nitride semiconductor device formed from, e.g., InGaAlN, by using a nitride material such as a nitride semiconductor.

In order to achieve the above object, according to the present invention, there is provided a sapphire substrate having a heteroepitaxial growth surface, wherein the heteroepitaxial growth surface is parallel to a plane obtained by rotating a $(01\bar{1}0)$ plane of the sapphire substrate about a c-axis of the sapphire substrate through 8° to 20° in a crystal lattice of the sapphire substrate.

DESCRIPTION OF THE PREFERRED EMBODIMENTS

Embodiments of the present invention will be described below with reference to the accompanying drawings.

A case wherein a gallium-nitride-based crystal film such as an InGaAlN film is to be grown on a crystal substrate of, e.g., sapphire (corundum) will be exemplified. The characteristic features of this embodiment will be briefly described first. In this embodiment, a plane formed by rotating the M plane of a sapphire substrate about a rotating axis in a specific direction is used as a heteroepitaxial growth surface, thereby suppressing twin crystal formation in growing a gallium-nitride-based crystal film. When twin crystal formation is suppressed, a gallium-nitride-based crystal having a flat surface and good crystallinity can be grown, and an electronic component with satisfactory characteristics can be obtained.

The sapphire substrate of this embodiment is different from a conventional substrate for semiconductor device including at least one InGaAlN layer in the following point. Conventionally, the M plane just surface of a sapphire substrate is used as a heteroepitaxial growth surface. In this embodiment, however, a plane that tilts with respect to the M plane of the sapphire substrate through an angle larger than the normal off angle is used as a heteroepitaxial growth surface, thereby forming a crystal film of a nitride material such as GaN.

The characteristic sapphire substrate of this embodiment will be referred to as a sapphire M-plane off-substrate, and the heteroepitaxial growth surface will be referred to as an M plane off surface. In the following description, the upper surface (the upper surface discriminated from the lower and side surfaces) of the substrate is used as a heteroepitaxial growth surface. The M plane will be described. A hexagonal structure such as corundum with a rhombohedral structure has a hexagonal columnar structure. M planes correspond to six rectangular side surfaces of the hexagonal column. Since the c-axis in the crystal is parallel to a direction that perpendicularly extends through the upper and lower surfaces having hexagonal shapes, the M planes are parallel to the c-axis. The plane orientations of the M planes are expressed by "Miller-Bravais" indices as $(1\bar{1}00)$, $(\bar{1}100)$, $(01\bar{1}0)$, $(0\bar{1}10)$, $(10\bar{1}0)$, and $(\bar{1}010)$. These can be expressed as $\{01\bar{1}0\}$ altogether.

A semiconductor device formed on the sapphire M-plane off-substrate of this embodiment is different from a conventional semiconductor device including at least one InGaAlN layer in the following points. Since the semiconductor device of this embodiment is formed on the sapphire M-plane off-substrate, the number of crystal defects in the semiconductor layer of the device is small. For this reason, satisfactory characteristics can be obtained, and the device lifetime is long. In the prior art, when a crystal is grown by lateral growth, a high-quality crystal is obtained only in a stripe shape. However, when the sapphire M-plane off-substrate is used, the result exhibiting satisfactory characteristics can be obtained on the entire substrate surface. Hence, no limitations are imposed on the layout and size of the device.

When the upper surface (heteroepitaxial growth surface) of the sapphire M-plane off-substrate has a tilt (the tilt angle, i.e., off angle equals the rotation angle) rotated about the c-axis of the sapphire substrate through 8° to 20°, a crystal step is formed on the substrate in the tilt direction of the substrate. This step suppressed twin crystal formation on the M plane just surface.

Figure 1:
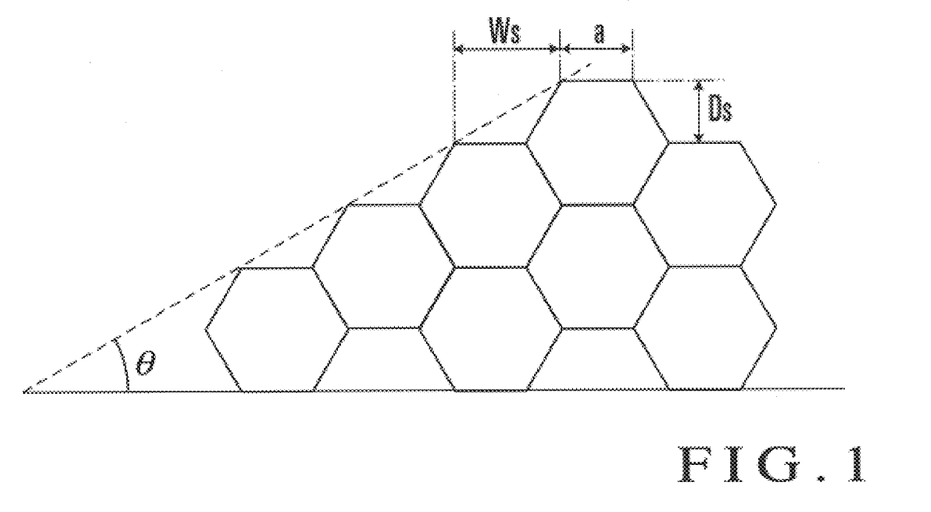
FIG. 1 is a sectional view showing a section of a sapphire M plane substrate, which is perpendicular to the c-axis.

This function will be described with reference to FIG. 1. FIG. 1 shows a section perpendicular to the c-axis of the sapphire substrate. The dotted line indicates the surface of a GaN buffer layer formed on the sapphire substrate. An angle θ made by the dotted line and the solid line is the tilt angle from the M plane of the substrate. Since the sapphire M plane is a stable plane, the M plane appears on the substrate surface independently of the tilt angle. A height $D_S$ of a step is constant because of the crystal structure, and it can be appropriately supposed as shown in FIG. 1. Hence, $D_S$ is given by $$D_S = a \times \sin 60° \quad (1)$$

where a is the length of the a-axis of the sapphire crystal. A width $W_S$ of the step can be estimated by $$W_S = D_S / \tan\theta \quad (2)$$

TABLE 1

| θ (deg) | $W_S$ (Å) |
|---|---|
| 1 | 236.17 |
| 2 | 118.05 |
| 4 | 58.95 |
| 6 | 39.22 |
| 8 | 29.33 |
| 10 | 23.38 |
| 15 | 15.38 |
| 20 | 11.33 |
| 30 | 7.14 |
| 40 | 4.91 |

$D_S$ = const.

$$W_s = \frac{a \sin 60°}{\tan\theta}$$

As is apparent from Table 1, when the tilt angle is small (off angle), the step width is large. That is, the flat portion (terrace portion) of the step becomes wide. For this reason, nuclei with c-axes set in arbitrary directions, i.e., the twin crystal formation directions in FIG. 8, are formed on an identical step. Hence, twin crystals are readily formed. In addition, as is apparent from Table 1, when the tilt angle of the substrate is large, the step width becomes small. In this case, since the center (terrace portion) of the step is narrow, nuclei hardly form, and two-dimensional crystal growth on the step hardly occurs. On the other hand, since atoms supplied from source materials for the growth readily stick to a kink portion formed by upper and lower steps adjacent to each other, growth from the kink portion becomes dominant.

Generally, to obtain a flat growth surface, the lateral diffusion distance of the add-atoms is preferably long. However, on an M plane tilted by a large angle, a nucleus is generated on a surface having many steps to grow a crystal, as described above. Hence, the distance to the next step can be short, and the lateral diffusion distance of the add-atoms can be short. According to this embodiment, the margin of growth condition becomes wide, and a flat growth surface can be more easily obtained.

When the substrate tilts in the [2$\bar{1}\bar{1}$0] direction, it will be examined whether a crystal having a c-axis tilted at 32° from the normal direction of the step to the [$\bar{2}$110] direction can be grown. The angle between the normal direction of the step and the sapphire M plane, which exists between this step and the neighbor step upper than this step, is 30°. Since this angle is smaller than the above-described 32°, a crystal of a gallium-nitride-based material hardly grows. Hence, a crystal having a c-axis tilted in the [2$\bar{1}\bar{1}$0] direction starts growing from the kink portion and grows in the [2$\bar{1}\bar{1}$0] direction on the step. As a consequence, this growth mode is dominant in growth on a tilted surface having a large crystal nucleus.

In the above description, the sapphire M-plane off-substrate tilts in the [2$\bar{1}\bar{1}$0] direction. However, the same applies to a case wherein the sapphire M-plane off-substrate tilts in the [$\bar{2}$110] direction as an opposite orientation.

The crystal growth will be examined from the viewpoint of the kinetics of add-molecules. In actual crystal growth, normally, not a three-dimensional growth mode but a two-dimensional growth mode for easily extending a step is used. Under this condition, a step extends to the left side of FIG. 1 (downstep). To extend the step to the right side of FIG. 1, molecules must stick to the upper step (upstep). The add-molecules require a larger kinetic energy to migrate to the upstep side than to the downstep side. A growth nucleus that readily extends to the downstep side must be a growth nucleus whose c-axis tilts to the downstep side. As a result, twin crystal formation is suppressed, and a single crystal with a single domain grows.

Embodiments of the present invention will be described next. These embodiments are mere examples, and various changes and modifications or improvements can be made without departing from the spirit and scope of the present invention.

<First Embodiment>

An actual GaN growing method will be described next.

(1) Substrate Used

Two sapphire substrates, i.e., a sapphire M-plane just-substrate and a sapphire M-plane off-substrate were used. The sapphire M-plane off-substrate had, as its upper surface, a plane rotated about the c-axis of the sapphire substrate through 15°. Each substrate had a size of 1-inch square, and the substrate thickness was 400 μm. The lower surface of each substrate was treated by lapping, and the growth surface (substrate surface) was mirror-polished. The tilt of this surface rotated about the a-axis fell within the range of 0.3°. This surface was not intentionally tilted.

(2) Substrate Cleaning

Each substrate was cleaned in acetone for 5 min by ultrasonic cleaning, washed in deioninzed water, and dried by injecting nitrogen gas.

(3) Transfer of Substrate to Growth Reactor

Each substrate was placed in the load-lock chamber of an equipment of metalorganic vapor phase epitaxy. After the load-lock chamber was evacuated to $1.3 \times 10^{-1}$ Pa ($10^{-6}$ Torr), the substrate was transferred to a growth reactor.

(4) Hydrogen Cleaning of Substrate

Each substrate was cleaned by heating it at 1,050° C. in a hydrogen atmosphere for 5 min. The pressure in the reactor at that time was $8.6 \times 10^4$ Pa (650 Torr). The pressure in the reactor was kept at $8.6 \times 10^4$ Pa (650 Torr) throughout the subsequent processes.

(5) Growth of GaN Buffer Layer

The temperature was reduced to 550° C., and GaN containing both an amorphous structure and a polycrystalline structure was grown to a film thickness of 25 nm (vapor phase epitaxy). As source gases, ammonia was used as a nitrogen source, and triethylgallium (to be referred to as TEGa hereinafter) was used as a gallium source. Hydrogen was used as the carrier and bubbling gases of TEGa. The material supply ratio V/III of ammonia to TEGa at that time was 61,200. The growth pressure was $8.6 \times 10^4$ Pa (650 Torr).

(6) Conversion of Buffer Layer to Single Crystal

The temperature was increased to 1,050° C., and the structure was held in a gas mixture of nitrogen and ammonia for 20 min so as to convert the buffer layer into a single crystal.

(7) High-temperature Growth of GaN

GaN was grown at 1,010° C. for 1 hr. The resultant film thickness was 0.95 μm. As source gases, ammonia was used as a nitrogen source, and trimethylgallium (to be referred to as TMGa hereinafter) was used as a gallium source. Hydrogen was used as the carrier and bubbling gases of TMGa. The material supply ratio V/III of ammonia to TMGa at that time was 2,800.

(8) Unload of Substrate

After the growth, the temperature was reduced at a rate of 40° C./min, and the substrate was unloaded. The cooling rate was set to 40° C./min because cooling at a rate of 100° C./min or more may break the substrate due to thermal distortion.

The characteristics of the obtained crystal will be described next.

Figure 2A:
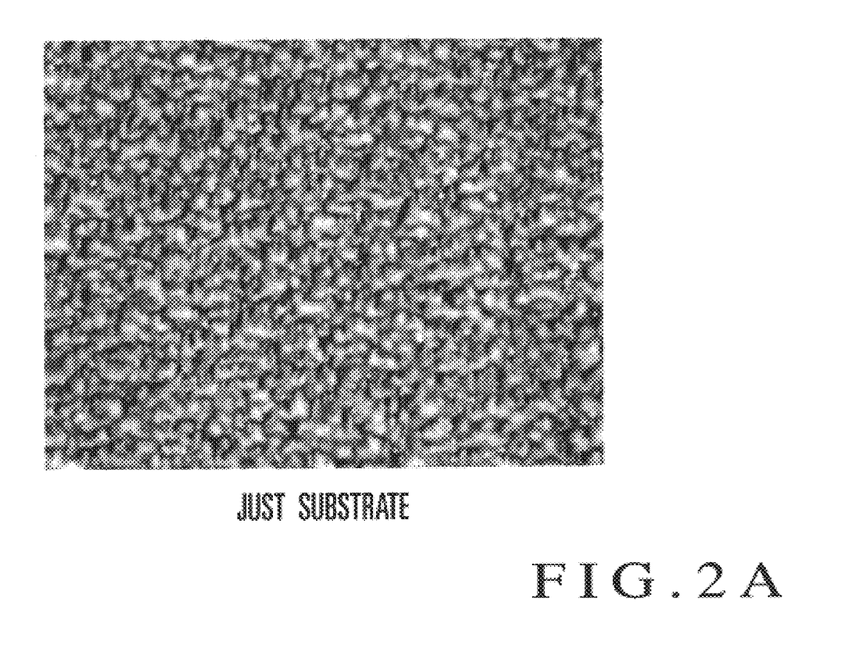
FIGS. 2A and 2B are photographs obtained by observing with a microscope the surfaces of GaN crystal layers grown on a sapphire M-plane just-substrate (a) and a sapphire M-plane off-substrate (b) via GaN buffer layers, respectively.
Figure 2B:
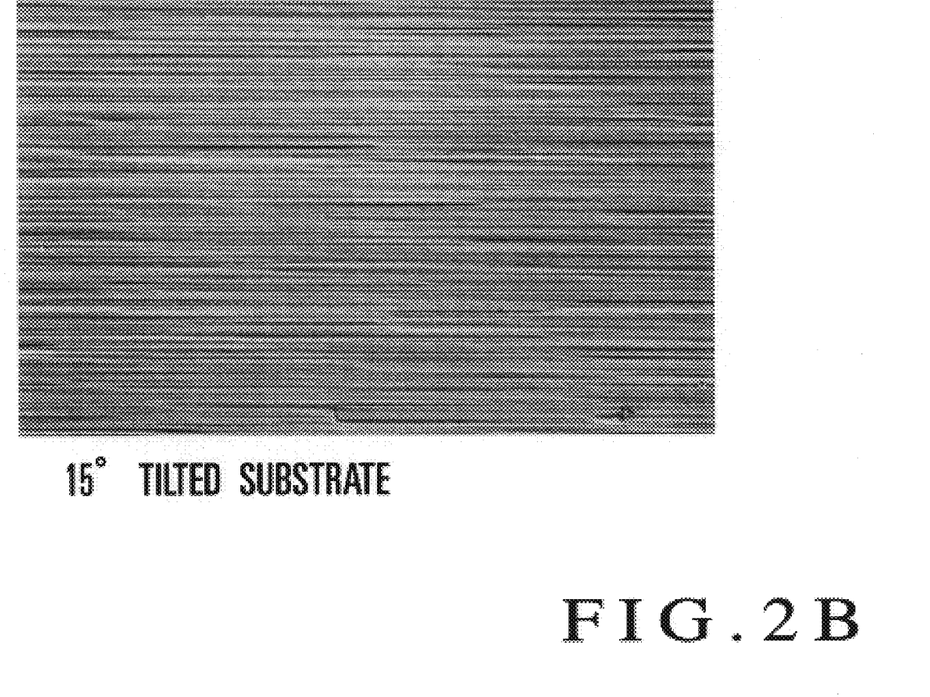

FIGS. 2A and 2B show photographs obtained by taking the surfaces of the grown GaN crystals with a differential interferometric optical microscope. FIG. 2A shows the surface morphology of a gallium nitride crystal film grown on an M-plane just-substrate via a GaN buffer layer. FIG. 2B shows the surface morphology of a gallium nitride crystal film grown on a surface (M-plane off-surface) rotated about the c-axis of the sapphire substrate through 15° via a GaN buffer layer.

For both the sapphire M just plane substrate and sapphire M-plane off-substrate, the tilt angle by rotation about the [2$\overline{1}\overline{1}$0] axis (a-axis) falls within the range of 0.3°, and the surface is not intentionally tilted, as described above. Referring to FIG. 2B, a stripe-shaped pattern is observed. The orientation of this pattern is parallel to the sapphire c-axis. The pattern is supposed to be formed from a GaN hexagonal column obtained by observing a side wall of the GaN hexagonal column obliquely from the upper side. The stripe-shaped pattern appears on the photograph because the step is emphasized and observed with the differential interferometric optical microscope. When the actual three-dimensional pattern was measured with an atomic force microscope, the step size was 1 nm or less, so the surface was considerably flat.

Figure 3A:
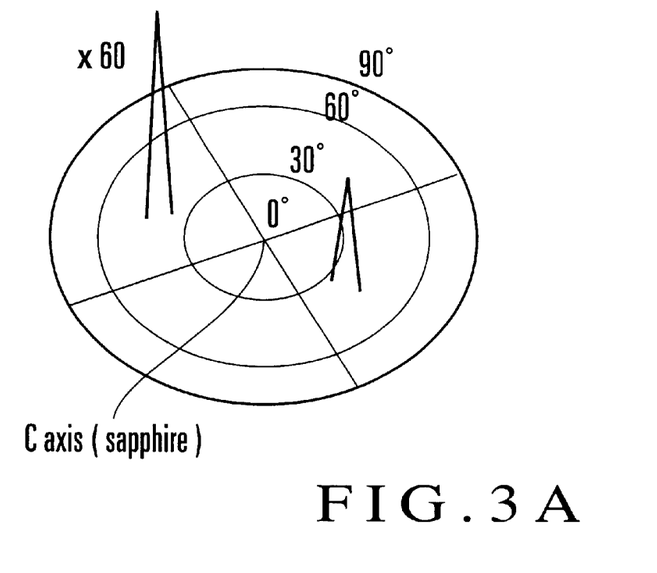
FIGS. 3A to 3D are views showing the results of measurement of pole figures on crystal using a reflection plane of GaN (0002) by a four-crystal X-ray diffraction apparatus.
Figure 3B:
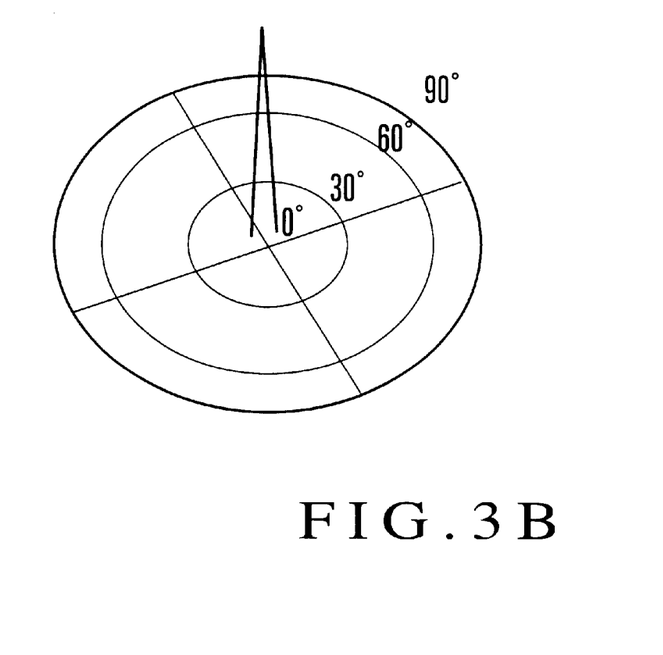

For samples identical to those in FIGS. 2A and 2B that show the surfaces of the samples, to determine whether twin crystals or a signal crystal is formed, pole figure measurement was done using a four-crystal X-ray diffraction apparatus (FIGS. 3A and 3B). In the pole figure measurement, the position of an X-ray detector is set at a position where reflection from GaN (0002) can be detected, and the X-ray diffraction intensity is measured while rotating the sample by in-plane rotation and swing. With this method, independently of the orientation of the GaN (0002), all GaN (0002) in the crystal can be detected.

Referring to FIGS. 3A and 3B showing pole figures, orientations indicated by rings correspond to the in-plane rotation of the samples. Orientations indicated by 0°, 30°, 60°, and 90° correspond to the rotational orientations of swing. In FIG. 3A corresponding to FIG. 2A, two peaks are observed. This means that GaN (0002) aligned in two different directions is contained in the crystal. Hence, twin crystals are obviously formed in the case shown in FIG. 3A.

To the contrary, a unimodal structure is observed in FIG. 3B corresponding to FIG. 2B. That is, GaN (0002) is aligned in one direction in the crystal. Hence, a single crystal grows in the case shown in FIG. 3B.

Figure 3C:
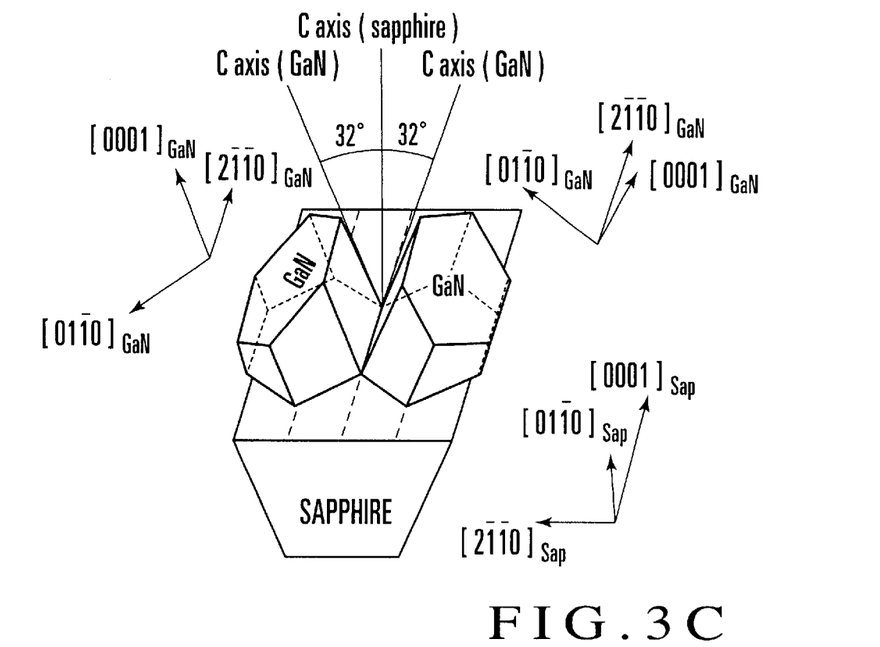
Figure 3D:
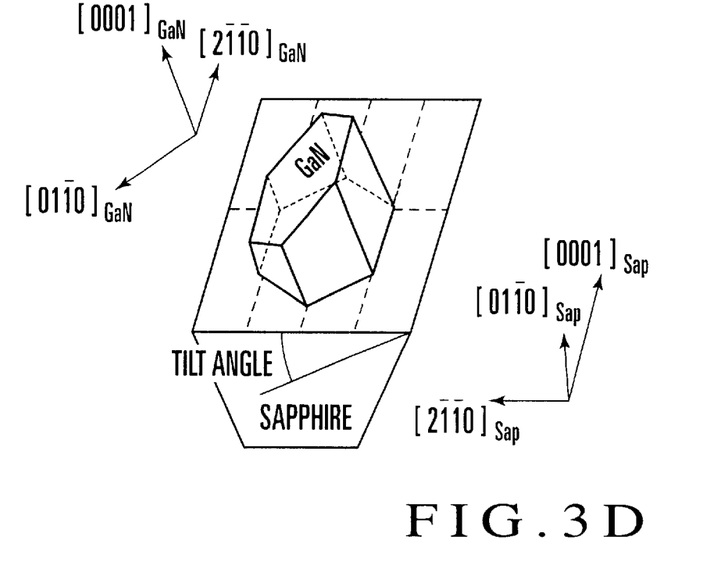

As is apparent from the above experimental results, twin crystals are obviously formed on the M-plane just-substrate, though single crystal growth can be realized on the substrate that tilts from the M plane through 15°. FIGS. 3C and 3D show crystal orientations corresponding to FIGS. 3A and 3B, respectively.

Figure 4:
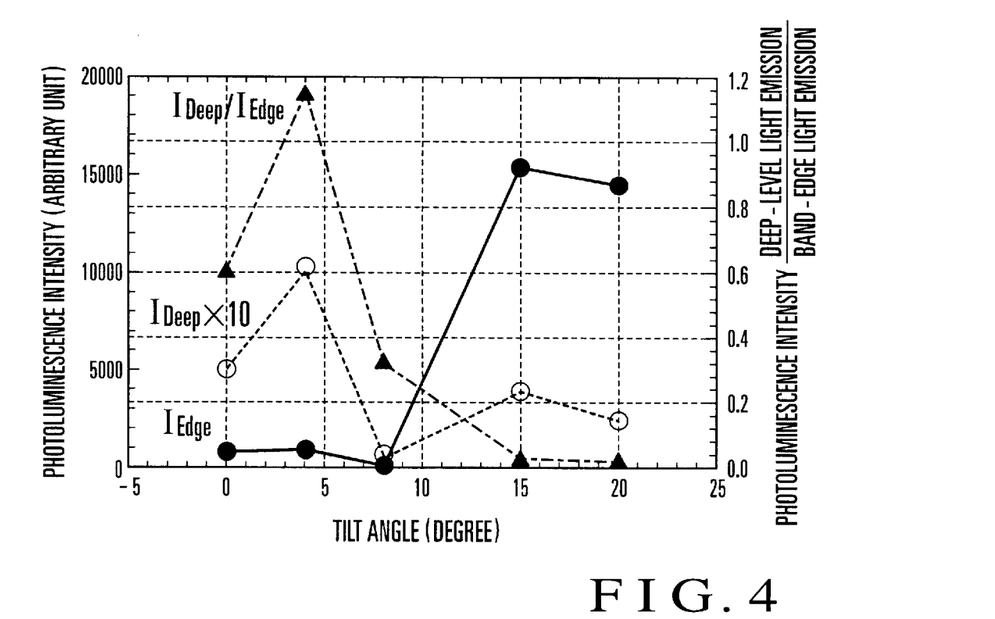
FIG. 4 is a graph showing the relationship between the tilt angle of the sapphire M plane substrate and the photoluminescence characteristic of a GaN crystal layer grown on the substrate, which is measured at room temperature.

FIG. 4 shows the relationship between the tilt angle of the substrate and a photoluminescence characteristic measured at room temperature. The larger the tilt angle is, the weaker yellow-band light emission near a wavelength of 500 nm, which is light emission from a deep level, becomes. On the other hand, band-edge light emission near a wavelength of 360 nm is dominant. The effect of the tilt angle can easily be understood from the intensity ratio (deep/edge) of deep-level light emission to band-edge light emission.

As described above, when the substrate was tilted at about 15°, a satisfactory GaN crystal could be obtained. As shown in FIG. 4, more satisfactory characteristics than in a case without any tilt appear for a tilt angle of 8° to 20°. An especially excellent characteristic is predicted to appear for a tilt angle of 13° to 18°.

A case wherein the substrate is tilted using, as a rotating axis, the c-axis with the largest effect has been described. When such a sapphire M-plane off-substrate is used, twin crystals are completely eliminated, though a stripe pattern parallel to the c-axis of the substrate is formed in the GaN. To eliminate the pattern to further flatten the substrate, using a substrate whose surface (heteroepitaxial growth surface) is tilted through 1° with respect to the c-axis without any rotation about the c-axis, a GaN buffer layer was formed on the substrate, and then, a GaN crystal was grown. As a result, the step flowed in growing the GaN crystal, and a mirror surface was obtained.

As for the planarity of the formed gallium nitride crystal film, no pattern was observed even with a differential interferometric optical microscope. Note that the tilt of the surface is obtained by rotating the substrate about a direction parallel to the surface and perpendicular to the c-axis. In this case, the surface tilts without any rotation about the c-axis, and the tilt angle equals the rotation angle. Although the tilt angle is set to 1°, this angle is not strictly limited. A necessary tilt angle is determined on the basis of the ratio of the step flow speed to the growth rate in the film thickness direction. The tilt angle depends on the growth conditions.

The angle of tilt with respect to the c-axis without any rotation about the c-axis is preferably 0.1° to 20° and, more preferably, 0.1° to 2°. Although GaN is used above as a buffer layer, the same effect of the substrate tilt angle as described above can be observed even with AlN. The growth temperature of an AlN buffer layer is 600° C., and the annealing temperature is 1,250° C., i.e., higher than for the GaN buffer layer.

In the above-described example, a GaN crystal is grown. However, the present invention is not limited to this. Even an InGaN or AlGaN crystal can be grown, as will be described below.

First, growth of an InGaN crystal will be described. A sapphire M-plane off-substrate is prepared, and a GaN buffer layer is formed on the substrate, as in the above-described case. The buffer layer is formed in the following way.

TEGa (trimethylgallium) is used as the source gas of Ga. The material cylinder which stores TEGa is set to about 11° C. Hydrogen is bubbled into TEGa stored in the material cylinder at a flow rate of 25 sccm to generate TEGa gas. This gas is supplied into the reactor of a crystal growing apparatus at a flow rate of about 3.85 $\mu$mol/min together with a carrier gas (hydrogen gas, flow rate: 1.5 slm). Ammonia gas as the source gas of nitrogen is supplied into the reactor at a flow rate of 5 slm. The material supply ratio V/III is 57,960.

Under these conditions, the source gases are supplied into the reactor, and the pressure in the reactor is set to 650 Torr. In this state, the sapphire M-plane off-substrate placed in the reactor is heated to about 550° C. to form an amorphous gallium nitride buffer layer on the sapphire M-plane off-substrate.

The resultant buffer layer is heated to 1,010° C. in an atmosphere containing ammonia (supplied at a flow rate of 0.1 slm) and nitrogen (supplied at a flow rate of 15 slm) for 20 min and thus converted into a single crystal.

An InGaN crystal is grown on the GaN buffer layer in the following way.

TEGa is used as the source gas of Ga. The material cylinder which stores TEGa is set to about 11° C. Nitrogen is bubbled into TEGa stored in the material cylinder at a flow rate of 50 sccm to generate TEGa gas. This gas is supplied into the reactor of the crystal growing apparatus at a flow rate of about 7.7 $\mu$mol/min together with a carrier gas (nitrogen gas, flow rate: 1.5 slm).

TMIn (trimethylindium) is used as the source gas of indium. The material cylinder which stores TMIn is set to about 20° C. Nitrogen is bubbled into TMIn stored in the material cylinder at a flow rate of 600 sccm to generate TMIn gas. This gas is supplied into the reactor of the crystal growing apparatus at a flow rate of about 60.3 $\mu$mol/min together with a carrier gas (nitrogen gas). In addition, ammonia gas as the source gas of nitrogen is supplied into the reactor at a flow rate of 15 slm. The material supply ratio V/III is 9,715.

Under these conditions, the source gases are supplied into the reactor, and the pressure in the reactor is set to 650 Torr. In this state, the sapphire M-plane off-substrate placed in the reactor is heated to about 800° C. to grow a crystal of an $In_{0.114}Ga_{0.886}N$ film on the GaN buffer layer. Even when an InGaN crystal is grown by the above-described method, a considerably flat crystal film can be obtained, like the above-described GaN. Note that the light emission wavelength of the grown InGaN crystal film is 400 nm at room temperature.

An InGaN crystal can also be grown at a lower temperature of about 500° C. However, since the activation ratio of ammonia decreases when the temperature is low, a high V/III ratio must be used. For example, when the growth temperature is 500° C., the V/III ratio is set to 160,000.

Growth of an AlGaN crystal will be described next. A sapphire M-plane off-substrate is prepared, as in the above-described case, and a GaN buffer layer is formed on the substrate according to the same procedure as described above.

An AlGaN crystal is grown on the GaN buffer layer in the following way. TEGa is used as the source gas of Ga. The material cylinder which stores TEGa is set to about 11° C. Hydrogen is bubbled into TEGa stored in the material cylinder at a flow rate of 84 sccm to generate TEGa gas. This gas is supplied into the reactor of the crystal growing apparatus at a flow rate of about 12.9 $\mu$mol/min together with a carrier gas (hydrogen gas, flow rate: 1.5 slm).

TMAl (trimethylaluminum) is used as the source gas of aluminum. The material cylinder which stores TMAl is set to about 17.2° C. Hydrogen is bubbled into TMAl stored in the material cylinder at a flow rate of 4 sccm to generate TMAl gas. This gas is supplied into the reactor of the crystal growing apparatus at a flow rate of about 1.87 $\mu$mol/min together with a carrier gas (hydrogen gas). Note that TMAl gas supply amount/(TMAl gas supply amount+TEGa gas supply amount)=0.13. In addition, ammonia gas as the source gas of nitrogen is supplied into the reactor at a flow rate of 15 slm. The material supply ratio V/III is 15,117.

Under these conditions, the source gases are supplied into the reactor, and the pressure in the reactor is set to 650 Torr. In this state, the sapphire M-plane off-substrate placed in the reactor is heated to about 1,010° C. to grow a crystal of an $Al_{0.15}Ga_{0.85}N$ film on the GaN buffer layer. Even when an AlGaN crystal is grown by the above-described method, a considerably flat crystal film can be obtained, like the above-described GaN.

An InGaAlN crystal film with good crystallinity can also be grown on a sapphire M-plane off-substrate according to the same procedure as described above. In the above-described case, a crystal is grown after a GaN buffer layer is formed on a sapphire M-plane off-substrate. However, a crystal may be directly grown on a sapphire M-plane off-substrate.

In growing, e.g., an InGaAlN crystal on a sapphire M-plane off-substrate, the lattice constants can be made to match by appropriately setting the composition ratio. The lattice constant of $In_{1-X-Y}Ga_XAl_YN$ is "lattice constant= lattice constant of InN×(1−X−Y)+lattice constant of GaN× X+lattice constant of AlN×Y".

<Second Embodiment>

Figure 5:
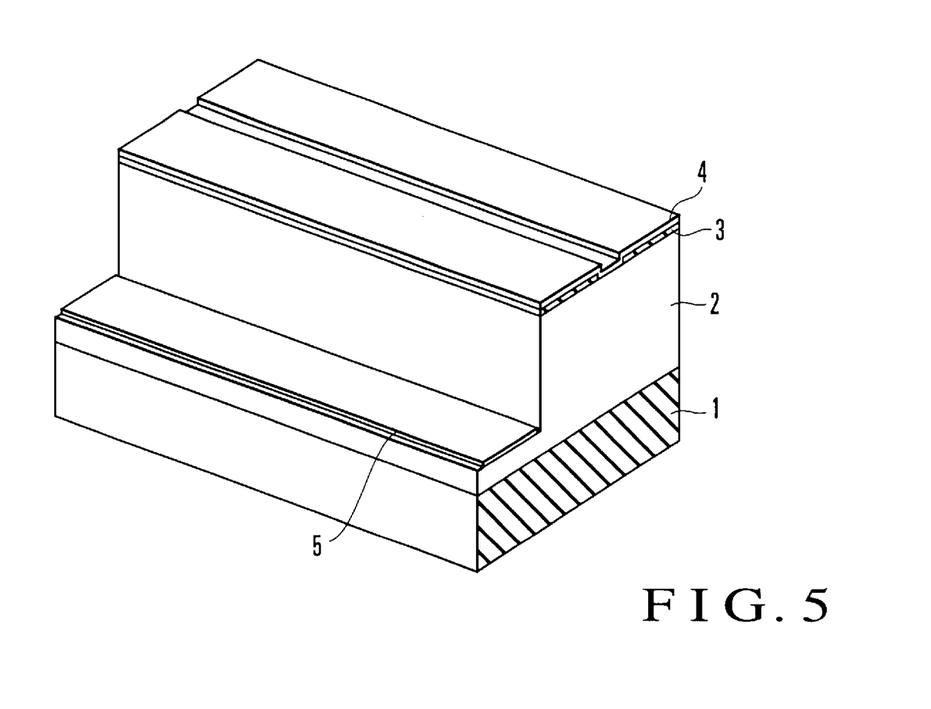
FIG. 5 is a perspective view schematically showing the structure of a semiconductor device according to an embodiment of the present invention.
Figure 6:
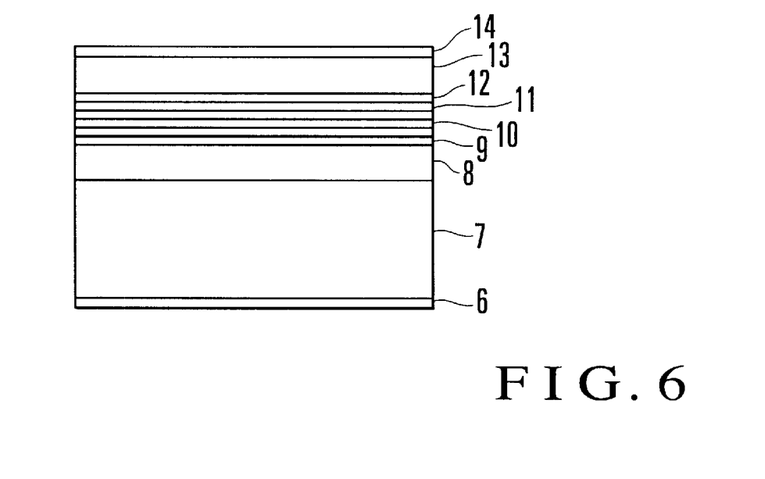
FIG. 6 is a sectional view showing details of part of the semiconductor device shown in FIG. 5.
Figure 7:
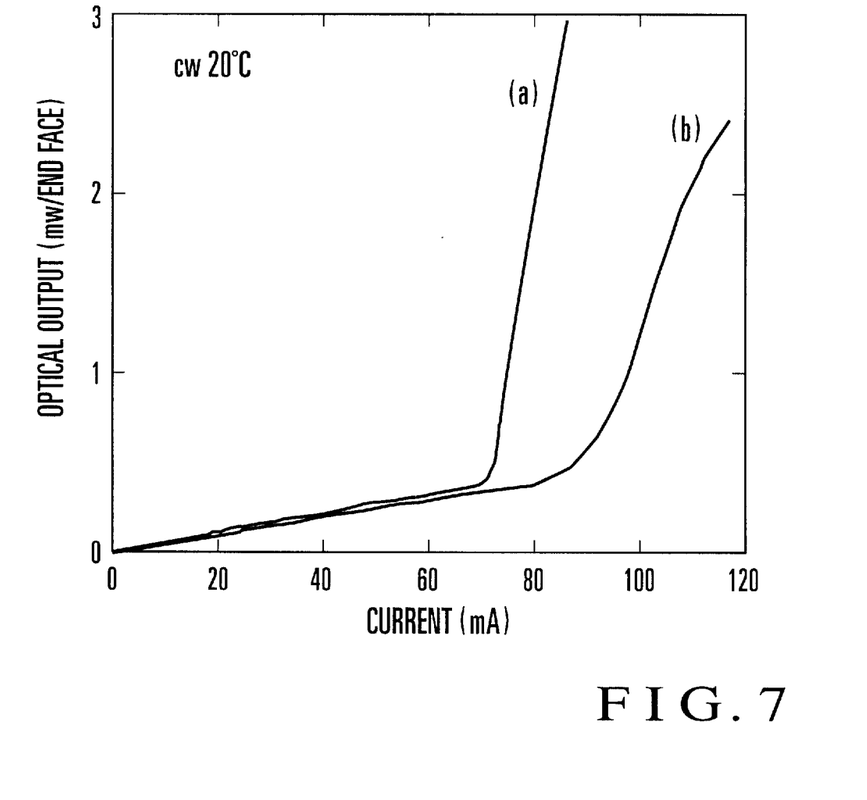
FIG. 7 is a graph showing the light vs. current characteristic of a semiconductor device formed on a sapphire M-plane off-substrate (a) and the light vs. current characteristic of a semiconductor device formed on a sapphire C plane substrate (b), respectively.

FIGS. 5, 6, and 7 explain the second embodiment of the present invention. FIG. 5 explains the schematic structure of a device according to this embodiment. This light-emitting element is formed by stacking a plurality of crystal layers such as a GaN layer and InGaAlN layer on a sapphire substrate whose M plane is rotated about the c-axis through 15°. Reference numeral 1 denotes a sapphire substrate whose M plane is rotated about the c-axis through 15°; 2, a layer formed from a plurality of semiconductor layers; 3, an $SiO_2$ insulating layer for current confinement; 4, a metal electrode layer formed by sequentially stacking Ni and Au on the semiconductor layer; and 5, a metal electrode layer formed by sequentially stacking Ti and Al on the semiconductor layer.

Details of part of the semiconductor layer 2 will be described with reference to the schematic sectional view shown in FIG. 6. Referring to FIG. 6, reference numeral 6 denotes a GaN buffer layer; 7, a silicon-doped n-type GaN layer; 8, a silicon-doped n-type $Al_{0.1}Ga_{0.9}N$ cladding layer; 9, a silicon-doped n-type GaN guiding layer; 10, an active layer formed from an $In_{0.2}Ga_{0.8}N/In_{0.05}Ga_{0.95}N$ quantum well structure; 11, a magnesium-doped p-type $Al_{0.2}Ga_{0.8}N$ barrier layer; 12, a magnesium-doped p-type GaN guiding layer; 13, a magnesium-doped p-type $Al_{0.15}Ga_{0.85}N$ cladding layer; and 14, a magnesium-doped p-type GaN contact layer.

A detailed method of manufacturing the device will be described. As the substrate 1, a 400-$\mu$m thick sapphire substrate (sapphire M-plane off-substrate) whose M plane is rotated about its c-axis through 15° is used.

To grow a semiconductor layer such as an InGaAlN layer, an equipment of metalorganic vapor phase epitaxy is used. As metal materials, organic metal materials are used. TEGa and trimethylgallium (TMGa) are used for gallium for the low-temperature grown GaN buffer layer 6 and high-temperature grown GaN. TMIn is used as the indium material. TMAl is used as the aluminum material. The carrier gas of the organic metals is hydrogen for the growth of AlGaN, and nitrogen for the growth of crystal system without indium. The nitrogen material is ammonia.

First, the low-temperature grown GaN buffer layer 6 is grown at 550° C. The thickness of the grown film is 20 nm. This layer acts as a buffer layer having a lattice-mismatch of about ±2% between the substrate and GaN.

The GaN buffer layer 6 is annealed in a mixed atmosphere of nitrogen and ammonia at 1,050° C. for 20 min.

The silicon-doped n-type GaN layer 7 for extracting an n-type electrode is grown to a thickness of 3 $\mu$m at 1,010° C. The carrier concentration is $3 \times 10^{18}/cm^3$. On the resultant structure, the silicon-doped n-type $Al_{0.1}Ga_{0.9}N$ cladding layer 8 having a thickness of 0.5 μm, the silicon-doped n-type GaN guiding layer 9 having a thickness of 0.1 μm, the quantum well structure 10 serving as an active layer formed from three pairs of undoped $In_{0.2}Ga_{0.8}N$ (thickness: 3 nm)/$In_{0.05}Ga_{0.95}N$ (thickness: 6 nm), the magnesium-doped p-type $Al_{0.2}Ga_{0.8}N$ barrier layer 11 having a thickness of 20 nm, the magnesium-doped p-type GaN guiding layer 12 having a thickness of 0.1 μm, the magnesium-doped p-type $Al_{0.15}Ga_{0.85}N$ cladding layer 13 having a thickness of 0.5 μm, and the magnesium-doped p-type GaN contact layer 14 having a thickness of 0.1 μm are continuously grown.

Before formation of a p-type electrode, the insulating film 3 is formed as a current confinement layer, as shown in FIG. 5, to concentrate the injected current. As for the shape of the insulating film 3, it has a size of 3 μm along the width of the exposed portion of the p-type GaN layer (a direction perpendicular to the axial direction of the cavity).

Next, nickel and gold (the layer 4 in FIG. 5) is deposited on the p-type GaN as a metal electrode. The metal layer 4 and semiconductor layers 8 to 14 are partially etched and removed by photolithography to expose the n-type GaN layer 7 for extracting the electrode. At this time, the layer 7 may also be partially etched.

After that, as shown in FIG. 5, the n-type metal electrode layer 5 is formed by depositing titanium and aluminum on the n-type GaN layer 7 for extracting the electrode and pattering them.

A method of forming a laser cavity will be described next. A cavity is formed such that its axial direction (the direction in which light reciprocates) becomes parallel to the c-axis of the sapphire substrate. This is because in cleaving a sapphire substrate, the R plane as an easily cleaved plane is exposed. In forming a cavity end face as a mirror, the stacked semiconductor layers were etched by dry etching technique. In forming a chip, the substrate was cleaved. FIG. 7 shows the light vs. current characteristic of a laser diode obtained by the above-described method (a). When the laser diode showed continuous-wave oscillation at room temperature, the threshold current of laser oscillation was 68 mA.

For comparison, FIG. 7 shows the light vs. current characteristic of a laser formed on a sapphire C-plane substrate and having the same structure as described above (b). The threshold current of the semiconductor laser device formed on the sapphire M-plane off-substrate of this embodiment is obviously smaller than that of the laser formed on the sapphire C-plane substrate. In addition, the laser formed on the sapphire M-plane off-substrate has a higher external quantum efficiency. This is because when the sapphire M-plane off-substrate is used, the lattice-mismatch becomes lower by about one order of magnitude as compared to the sapphire C-plane substrate, and the crystallinity improves.

As described above, when InGaAlN is grown on a sapphire M-plane off-substrate, the crystal can be grown by a simple process with high reproducibility without forming any twin crystals, unlike InGaAlN on an M-plane just-substrate in which twin crystals are formed. For this reason, flat InGaAlN having good crystallinity can be obtained, and a semiconductor device having excellent electrical/optical characteristics and long device-lifetime can be manufactured using the InGaAlN. Additionally, since the orientation of the crystal film of InGaAlN tilts from the normal direction of the substrate surface, the piezoelectric effect that decreases the light emission efficiency can be suppressed as compared to a case wherein a sapphire C-plane substrate is used.

In the above embodiment, a combination of a sapphire M-plane off-substrate having a surface which tilts with respect to the sapphire M-plane at an angle larger than a normal off-angle and a gallium-nitride-based semiconductor material has been described. However, the present invention is not limited to this. The present invention can also be applied to a combination of another nitride material and a crystal substrate whose major surfaces are defined as a plane obtained by rotating the $\{01\bar{1}0\}$ plane of a crystal having another rhombohedral crystal structure about the c-axis through 8° to 20° and, more preferably, 13° to 18° and a plane tilted with respect to the c-axis through 0.1° to 20° and, more preferably, 0.1° to 2°.

Examples of planes rotated about the c-axis from the $\{01\bar{1}0\}$ plane (M-plane) through 8° to 20° are $\{1\,2\,\bar{3}\,0\}$, $\{1\,3\,\bar{4}\,0\}$, $\{2\,3\,\bar{5}\,0\}$, $\{1\,4\,\bar{5}\,0\}$, $\{3\,4\,\bar{7}\,0\}$, $\{4\,5\,\bar{9}\,0\}$, $\{2\,5\,\bar{7}\,0\}$, $\{2\,7\,\bar{9}\,0\}$, $\{3\,5\,\bar{8}\,0\}$, $\{3\,7\,\overline{10}\,0\}$, $\{3\,8\,\overline{11}\,0\}$, $\{3\,10\,\overline{13}\,0\}$, $\{3\,13\,\overline{16}\,0\}$, $\{4\,7\,\overline{11}\,0\}$, $\{4\,9\,\overline{13}\,0\}$, $\{4\,11\,\overline{15}\,0\}$, $\{4\,13\,\overline{17}\,0\}$, $\{4\,15\,\overline{19}\,0\}$, and $\{4\,17\,\overline{21}\,0\}$.

Of these planes, $\{1\,3\,\bar{4}\,0\}$, $\{2\,5\,\bar{7}\,0\}$, $\{2\,7\,\bar{9}\,0\}$, $\{3\,7\,\overline{10}\,0\}$, $\{3\,8\,\overline{11}\,0\}$, $\{3\,10\,\overline{13}\,0\}$, $\{4\,11\,\overline{15}\,0\}$, and $\{4\,13\,\overline{17}\,0\}$ are planes rotated about the c-axis from the $\{01\bar{1}0\}$ plane through 13° to 18°.

In the contents represented by {h k l 0}, l=−(h+k). They include planes represented by changing the order of h, k, and l, i.e., (h k l 0), (h l k 0), (k h l 0), (k l h 0), (l h k 0), and (l k h 0). They also include planes having indices with an opposite sign, i.e., $(\bar{h}\,\bar{k}\,\bar{l}\,0)$, $(\bar{h}\,\bar{l}\,\bar{k}\,0)$, $(\bar{k}\,\bar{h}\,\bar{l}\,0)$, $(\bar{k}\,\bar{l}\,\bar{h}\,0)$, $(\bar{l}\,\bar{h}\,\bar{k}\,0)$, and $(\bar{l}\,\bar{k}\,\bar{h}\,0)$.

Examples of a crystal having a rhombohedral crystal structure are α-$Fe_2O_3$, $Ga_2O_3$, $Rh_2O_3$, and $Ti_2O_3$. The crystal lattice constants and lattice-mismatches with gallium nitride of typical rhombohedral crystal structures will be described below.

Corundum ($Al_2O_3$)
    Lattice constant a: 0.476 nm, b: 1.294 nm, lattice-mismatch GaN [$03\bar{3}2$]: 2.64%, GaN [$2\bar{1}\bar{1}2$]: −1.41%

α-$Fe_2O_3$
    Lattice constant a: 0.504 nm, b: 1.372 nm, lattice-mismatch GaN [$03\bar{3}2$]: −2.98%, GaN [$2\bar{1}\bar{1}2$]: −7.52%

$Ga_2O_3$
    Lattice constant a: 0.498 nm, b: 1.343 nm, lattice-mismatch GaN [$03\bar{3}2$]: −1.84%, GaN [$2\bar{1}\bar{1}2$]: −5.24%

$Rh_2O_3$
    Lattice constant a: 0.511 nm, b: 1.382 nm, lattice-mismatch GaN [$03\bar{3}2$]: −4.51%, GaN [$2\bar{1}\bar{1}2$]: −8.31%

$Ti_2O_3$
    Lattice constant a: 0.515 nm, b: 1.364 nm, lattice-mismatch GaN [$03\bar{3}2$]: −5.29%, GaN [$2\bar{1}\bar{1}2$]: −6.87%

In the above description, a crystal is grown by metalorganic vapor phase epitaxy. However, the present invention is not limited to this. For example, a crystal may be grown by an MBE (Molecular Beam Epitaxy). In this case, metal In, metal Ga, and metal Al are used as group III materials, and nitrogen or ammonia is used as a nitrogen material. In the MBE, these gases are supplied into an ECR plasma cell or an rf plasma cell, decomposed into nitrogen atom radicals or nitrogen molecule radicals by discharge in the cell, and supplied into the chamber.

For the crystal growth by the MBE, as the pressure in the chamber, a pressure with which the mean-free-path becomes more than the distance from the cells of sources to the substrate is used such that the material reaches the growth substrate as a beam. Generally, the pressure has a degree of vacuum higher than $10^{-6}$ Torr. An MBE using a gas as a group V material is sometimes discriminated as a gas-source MBE.

To grow a crystal, a CBE (Chemical Beam Epitaxy) may be used. In this case, the same organic materials as in the above-described metalorganic vapor phase epitaxy are used as group III materials, and nitrogen or ammonia is used as the nitrogen material, as in the MBE.

As described above, to form a crystal layer of a nitride material in this embodiment, various kinds of vapor phase epitaxy can be used.

By practicing the present invention, an epitaxial growth substrate capable of growing a group III nitride semiconductor InGaAlN by a simple process with high reproducibility can be provided. In addition, a semiconductor device which is formed from InGaAlN, can be manufactured at low cost and high yield, and has excellent electrical/optical characteristics and long device lifetime can be provided.

Generally, a semiconductor material is required to have a large band-gap energy and high melting-point. A semiconductor material having a large band-gap energy has a high breakdown-voltage and can apply a high electric field and therefore can implement a transistor capable of high-speed operation. When a semiconductor material having a high melting-point is used, operation at high temperature can be performed, and high-power operation is also possible.

Such characteristics are required for the semiconductor materials, and especially, nitride semiconductor materials such as gallium-nitride-based materials have received a great deal of attention.

Conventionally, devices are manufactured using an InGaAlN crystal. Such a nitride semiconductor is used for a light-emitting element with a shorter wavelength than the wavelength in green color. As light-emitting elements using a nitride semiconductor, LEDs have been put into practical use and used for optical memories, full-color display devices, traffic signals, and the like. The LEDs are also used for deodorizers using a method of decomposing a chemical substance by UV-light irradiation. However, semiconductor lasers using a gallium-nitride-based semiconductor have not been put into practical use yet. This is because the device lifetime is short because of a number of crystal defects contained in the crystal.

A nitride semiconductor is expected as a promising semiconductor material capable of realizing more excellent characteristics because high-speed, high-power, and high-temperature operation is possible as compared to a transistor conventionally practiced using AlGaAs or silicon. Since a nitride semiconductor is a wide-gap semiconductor, the breakdown voltage and melting point are high, and therefore, the above-described characteristics are obtained.

For an HEMT (High-Electron-Mobility Transistor), because of the difference in crystal structure, a piezoelectric effect is obtained due to distortion based on lattice-mismatch between upper and lower crystal layers, unlike a GaAs-based semiconductor or silicon, and spontaneous polarization occurs due to the wurtzite crystal structure. For this reason, the electron density in a two-dimensional-electron gas layer increases, and consequently, large-current operation can be expected. An example has been reported in that a device experimentally manufactured using a nitride semiconductor operated at 140 GHz at maximum.

However, since the device lifetime is still short, such a device has not been put into practical use yet. In addition, a large electric field cannot be applied against expectations from the wide band-gap.

A nitride semiconductor is also expected to be applied to a special photodetector. Since a nitride semiconductor has a wide band-gap, a photodetector that does not respond to sunlight can be manufactured. The main application purpose of this photodetector is a flare monitoring apparatus (flare detector) used for combustion apparatus. However, such a photodetector has not been put into practice yet because the dark current of the device becomes large due to a number of crystal defects contained in the material.

A nitride semiconductor is also expected to be applied to a cathode material for electron emission. It is predicted that the electron affinity of AlN is negative. The characteristics have been surveyed by actually manufacturing a cathode, and it is found that a large current can be extracted at a low voltage. This cathode is industrially expected to be applied to an electron-emission gun for a plasma display or electron microscope. However, contrary to expectations from the physical properties, low-voltage/large-current operation cannot be obtained because a large number of crystal defects are contained in the material of the manufactured device.

In manufacturing a device using a nitride semiconductor described above, a crystal of the nitride semiconductor must be heteroepitaxially grown on a substrate. This is because no crystal substrate (bulk material) of the material is not obtained. Since the vapor pressure of nitrogen in the solid phase is high, a crystal of a nitride semiconductor can hardly be grown by the conventional method. A crystal of a nitride semiconductor may be grown by applying a pressure as high as 15,000 atm. In this case, however, only a small crystal having a size of several-mm square is obtained, and it cannot be practically used to manufacture a device.

As compared to the above-described prior arts, in an embodiment of the present invention, a crystal of a nitride semiconductor is grown on, e.g., a sapphire M-plane off-substrate. As a result, a crystal layer of a nitride semiconductor can be obtained with little lattice-mismatch. When a large sapphire M-plane off-substrate is used, a large crystal layer can be obtained. According to an embodiment of the present invention, a flat surface morphology of a nitride semiconductor can be obtained.

Hence, according to the present invention, many devices described above can be obtained for practical use.

What is claimed is:

1. A sapphire substrate having a heteroepitaxial growth surface, wherein the heteroepitaxial growth surface is parallel to a plane obtained by rotating a $(01\bar{1}0)$ plane of said sapphire substrate about a c-axis of said sapphire substrate through 8° to 20° in a crystal lattice of said sapphire substrate.

2. A sapphire substrate having a heteroepitaxial growth surface, wherein the heteroepitaxial growth surface is parallel to a plane obtained by rotating a $(01\bar{1}0)$ plane of said sapphire substrate about a c-axis of said sapphire substrate through 13° to 18° in a crystal lattice of said sapphire substrate.

3. A sapphire substrate having a hereroepitaxial growth surface, wherein the heteroepitaxial growth surface is parallel to a plane obtained by rotating a $\{01\bar{1}0\}$ plane of said sapphire substrate about a c-axis of said sapphire substrate through 8° to 20° in a crystal lattice of said sapphire substrate and tilting the plane by 0.1° to 20° with respect to the c-axis, said tilting not involving any rotation about the c-axis.

4. A sapphire substrate having a heteroepitaxial growth surface, wherein the heteroepitaxial growth surface is parallel to a plane obtained by rotating a $\{01\bar{1}0\}$ plane of said sapphire substrate about a c-axis of said sapphire substrate through 8° to 20° in a crystal lattice of said sapphire substrate and tilting the plane by 0.1° to 2° with respect to the c-axis said tilting not involving any rotation about the c-axis.

5. A semiconductor device comprising at least one layer of a single crystal of a group III nitride InN, GaN, or AlN or a mixed crystal $In_{1-X-Y}Ga_XAl_YN$ ($0 \leq X<1, 0 \leq Y<1$, and $0<X+Y \leq 1$) grown on a sapphire substrate, said substrate having a heteroepitaxial growth surface, in which the heteroepitaxial growth surface is parallel to a plane obtained by rotating a $(01\overline{1}0)$ plane of said sapphire substrate about a c-axis of said sapphire substrate through 8° to 20° in a crystal lattice of said sapphire substrate.

6. A semiconductor device comprising at least one layer of a single crystal of a group III nitride InN, GaN, or AlN or a mixed crystal $In_{1-X-Y}Ga_XAl_YN$ ($0 \leq X<1, 0 \leq Y<1$, and $0<X+Y \leq 1$) grown on a sapphire substrate, said substrate having a heteroepitaxial growth surface, in which the heteroepitaxial growth surface is parallel to a plane obtained by rotating a $(01\overline{1}0)$ plane of said sapphire substrate about a c-axis of said sapphire substrate through 13° to 18° in a crystal lattice of said sapphire substrate.

7. A semiconductor device comprising at least one layer of a single crystal of a group III nitride InN, GaN, or AlN or a mixed crystal $In_{1-X-Y}Ga_XAl_YN$ ($0 \leq X<1, 0 \leq Y<1$ and $0<X+Y \leq 1$) grown on a sapphire substrate, said substrate having a heteroepitaxial growth surface, in which the heteroepitaxial growth surface is parallel to a plane obtained by rotating a $\{01\overline{1}0\}$ plane of said sapphire substrate about a c-axis of said sapphire substrate through 8° to 20° in a crystal lattice of said sapphire substrate and tilting the plane by 0.1° to 2° with respect to the c-axis, said tilting not involving any rotation about the c-axis.

8. A semiconductor device comprising at least one layer of a single crystal of a group III nitride InN, GaN, or AlN or a mixed crystal $In_{1-X-Y}Ga_XAl_YN$ ($0 \leq X<1, 0 \leq Y<1$ and $0<X+Y \leq 1$) grown on a sapphire substrate, said substrate having a heteroepitaxial growth surface, in which the heteroepitaxial growth surface is parallel to a plane obtained by rotating a $\{01\overline{1}0\}$ plane of said sapphire substrate about a c-axis of said sapphire substrate through 8° to 20° in a crystal lattice of said sapphire substrate and tilting the plane by 0.1° to 2° with respect to the c-axis, said tilting not involving any rotation about the c-axis.

9. An electronic component comprising at least:
a crystal substrate having a rhombohedral crystal structure and, as a major surface, a plane rotated about a c-axis from a $\{01\overline{1}0\}$ plane over an angle in the range from 10° to 20°; and
a crystal layer of a nitride material grown on the major surface of said crystal substrate.

10. An electronic component characterized by comprising at least:
a crystal substrate (1) having a rhombohedral crystal structure and, as a major surface, a plane rotated about a c-axis from a $\{01\overline{1}0\}$ plane over an angle in the range from 13° to 18°; and
a crystal layer (2) of a nitride material grown on the major surface of said crystal substrate.

11. An electronic component comprising at least:
a crystal substrate having a rhombohedral crystal structure and having as a major surface a plane rotated about a c-axis from a $\{01\overline{1}0\}$ plane over an angle in the range from 13° to 18°; and
a crystal layer of a nitride material grown on the major surface of said crystal substrate, wherein said crystal substrate is a corundum substrate.

12. A component according to claim 9, wherein the major surface of said crystal substrate is a plane tilted by 0.1° to 20° with respect to the c-axis.

13. A component according to claim 12, wherein said crystal substrate is a corundum substrate.

14. A component according to claim 9, wherein the major surface of said crystal substrate is a plane tilted by 0.1° to 2° with respect to the c-axis.

15. A component according to claim 14, wherein said crystal substrate is a corundum substrate.

16. A component according to claim 9, wherein the nitride material is a semiconductor material containing nitrogen and gallium.

17. An electronic component comprising at least:
a crystal substrate having a rhombohedral crystal structure and having as a major surface a plane rotated about a c-axis from a $\{01\overline{1}0\}$ plane over an angle in the range from 10° to 20°; and
a crystal layer of a nitride material grown on the major surface of said crystal substrate wherein the nitride material is a semiconductor material containing nitrogen and gallium,
wherein said crystal substrate is a corundum substrate.

18. A component according to claim 16, wherein the nitride material is a semiconductor material containing indium and aluminum in addition to nitrogen and gallium.

19. An electronic component comprising at least:
a crystal substrate having a rhombahedral crystal structure and having as a major surface a plane rotated about a c-axis from a $\{01\overline{1}0\}$ plane over an angle in the range from 10° to 20°; and
a crystal layer of a nitride material grown on the major surface of said crystal substrate,
wherein the nitride material is a semiconductor material containing nitrogen and gallium,
wherein the nitride material is a semiconductor material containing indium and aluminum in addition to nitrogen and gallium, and
wherein said crystal substrate is a corundum substrate.

20. An electronic component comprising at least:
a crystal substrate having a rhombohedral crystal structure and having as a major surface a plane rotated about a c-axis from a $\{01\overline{1}0\}$ plane over an angle in the range from 10° to 20°; and
a crystal layer of a nitride material grown on said major surface of said crystal substrate, and
wherein said crystal substrate is a corundum substrate.

21. An electronic component comprising ax least:
a crystal substrate having a rhombohedral crystal structure and having as a major surface a plane rotated about a c-axis from a $\{01\overline{1}0\}$ plane over an angle in the range from 10° to 20°; and
at least one layer of a single crystal of a group UT nitride InN, GaN, or AlN or a mixed crystal $In_{1-X-Y}Ga_XAl_YN$ ($0 \leq X<1, 0 \leq Y<1$, and $0<X+Y \leq 1$) grown on said crystal substrate, and
wherein said major surface being a heteroepitaxial growth surface, in which the heteropiraxial growth surface is parallel to a plane obtained by rotating a $\{01\overline{1}0\}$ plane of said crystal substrate about a c-axis of said crystal substrate over an angle in the range from 8° to 20° in a crystal lattice of said crystal substrate, wherein said crystal substrate is a corundum substrate.

22. An electronic component comprising at least:
a crystal substrate having a rhombohedral crystal structure and having as a major surface a plane rotated about ac-axis from a $\{01\overline{1}0\}$ plane over an angle in the range from 13° to 18°; and
at least one layer of a single crystal of a group III nitride InN, GaN, or AlN or a mixed crystal $In_{1-X-Y}Ga_XAl_YN$ ($0 \leq X < 1$, $0 \leq Y < 1$, and $0 < X+Y \leq 1$) grown on said crystal substrate, and wherein said major surface being a heteroepitaxial growth surface, in which the heteroepitaxial growth surface is parallel to a plane obtained by rotating a $\{01\bar{1}0\}$ plane of said crystal substrate about a c-axis of said crystal substrate over an angle in the range from 13° to 18° in a crystal lattice of said crystal substrate, wherein said crystal substrate is a corundum substrate.

23. The component defined by claim 13 wherein the crystal layer includes at least one layer of a single crystal of a group III nitride InN, GaN, or AlN or a mixed crystal $In_{1-X-Y}Ga_XAl_YN$ ($0 \leq X < 1$, $0 \leq Y < 1$ and $0 \leq X+Y \leq 1$) and said major surface being a heteroepitaxial growth surface, in which the heteroepitaxial growth surface is parallel to a plane obtained by rotating a $\{01\bar{1}0\}$ plane of said crystal substrate about a c-axis of said crystal substrate over an angle in the range from 80 to 200 in a crystal lattice of said substrate and tilting the plane by 0.1° to 20° with respect to the c-axis without any rotation about the c-axis.

24. The component defined by claim 15 wherein the crystal layer includes at least one layer of a single crystal of a group III nitride InN, GaN, or AlN or a mixed crystal $In_{1-X-Y}Ga_XAl_YN$ ($0 \leq X < 1$, $0 \leq Y < 1$, and $0 < X+Y \leq 1$) and said major surface being a heteroepitaxial growth surface, in which the heteroepitaxial growth surface is parallel to a plane obtained by rotating a $\{01\bar{1}0\}$ plane of said crystal substrate about a c-axis of said crystal substrate Over an angle in the range from 8° to 20° in a crystal lattice of said crystal substrate and tilting the plane by 0.1° to 2° with respect to the c-axis without any rotation about the c-axis.

* * * * *

UNITED STATES PATENT AND TRADEMARK OFFICE
CERTIFICATE OF CORRECTION

PATENT NO. : 6,586,819 B2
DATED : July 1, 2003
INVENTOR(S) : Matsuoka

It is certified that error appears in the above-identified patent and that said Letters Patent is hereby corrected as shown below:

Column 16,
Line 44, please delete "ax least:" and insert -- at least: --.
Line 50, please delete "UT nitride" and insert -- III nitride --.
Line 63, please delete "ac-axis" and insert -- a c-axis --.

Column 18,
Line 1, please delete "80 to 200" and insert -- 8° to 20° --.
Line 12, please delete "Over" and insert -- over --.

Signed and Sealed this

Twenty-eighth Day of December, 2004

JON W. DUDAS
*Director of the United States Patent and Trademark Office*